(12) United States Patent
Sharma et al.

(10) Patent No.: US 12,489,455 B2
(45) Date of Patent: Dec. 2, 2025

(54) ADC ARCHITECTURE WITH NON-UNIFORM QUANTIZATION

(71) Applicant: Apple Inc., Cupertino, CA (US)

(72) Inventors: Utkarsh Sharma, Los Angeles, CA (US); Gokce Gurun, San Jose, CA (US); Sanjeev K. Maheshwari, Fremont, CA (US)

(73) Assignee: Apple Inc., Cupertino, CA (US)

( * ) Notice: Subject to any disclaimer, the term of this patent is extended or adjusted under 35 U.S.C. 154(b) by 110 days.

(21) Appl. No.: 18/443,547

(22) Filed: Feb. 16, 2024

(65) Prior Publication Data
US 2025/0266844 A1    Aug. 21, 2025

(51) Int. Cl.
*H03M 1/38* (2006.01)
*H03M 1/46* (2006.01)

(52) U.S. Cl.
CPC .................. *H03M 1/462* (2013.01)

(58) Field of Classification Search
CPC ........ H03M 1/38; H03M 1/468; H03M 1/462; H03M 1/466; H03M 1/1245; H03M 1/125; H03M 1/1215; H03M 1/46; H03M 1/12; H03M 1/00; H03M 1/121; H03M 1/002; H03M 1/1009; H03M 1/145; H03M 1/40; H03M 1/0607; H03M 1/10; H03M 1/1023; H03M 1/804; H03M 3/426; H03M 1/0695; H03M 1/08; H03M 1/0863; H03M 1/06; H03M 1/069; H03M 1/1014; H03M 1/1061; H03M 1/42; H03M 3/464; H03M 1/0624; H03M 1/0678; H03M 1/124; H03M 3/02; H03M 3/452; H03M 1/0609; H03M 1/0675; H03M 1/0836; H03M 1/0854; H03M 1/1038; H03M 1/123; H03M 1/14; H03M 1/164; H03M 1/181; H03M 1/34; H03M 1/361; H03M 1/502; H03M 1/54; H03M 1/66; H03M 3/022; H03M 3/32; H03M 3/398; H03M 3/458; H03M 3/46; H03M 3/494; H03M 1/001; H03M 1/0617;
(Continued)

(56) References Cited

U.S. PATENT DOCUMENTS

| 7,554,478 B2 * | 6/2009 | Lim ........................ H03M 1/56 341/169 |
| 7,916,063 B1 * | 3/2011 | Portmann ............. H03M 1/466 341/163 |

(Continued)

*Primary Examiner* — Linh V Nguyen
(74) *Attorney, Agent, or Firm* — Kowert, Hood, Munyon, Rankin & Goetzel, P.C.; Dean M. Munyon

(57) ABSTRACT

An ADC with non-uniform quantization is disclosed. A SAR ADC includes a comparator configured to generate, during successive clock cycles, respective comparison signals based on an analog input signal and a corresponding offset voltage. The SAR ADC further includes a digital logic circuit configured to store values of the respective comparison signals for corresponding ones of the successive clock cycles and further configured to output a digital value after a specified number of successive clock cycles. An offset control circuit is configured to, for a current one of the successive clock cycles, generate the corresponding value of the offset voltage based on one or more of values of the respective comparison signals from previous clock cycles. Respective offset voltages for successive clock cycles are spaced such that the SAR ADC implements non-uniform quantization values.

20 Claims, 10 Drawing Sheets

(58) Field of Classification Search
CPC .............. H03M 1/0641; H03M 1/1205; H03M 1/1255; H03M 1/1265; H03M 1/167; H03M 1/168; H03M 1/365; H03M 1/403; H03M 1/56; H03M 1/60; H03M 1/687; H03M 1/765; H03M 3/338; H03M 3/34; H03M 3/414; H03M 7/165
USPC ........ 341/118, 120, 155, 161, 162, 164, 165, 341/172
See application file for complete search history.

(56) References Cited

U.S. PATENT DOCUMENTS

| | | | |
|---|---|---|---|
| 8,854,240 B2 | 10/2014 | Chen et al. | |
| 9,048,860 B1* | 6/2015 | Quinn | H03M 1/46 |
| 9,184,755 B2* | 11/2015 | Kimura | H01L 23/5226 |
| 9,774,345 B1 | 9/2017 | Yoshioka et al. | |
| 2014/0022105 A1* | 1/2014 | Chen | H03M 1/0682 |
| | | | 341/161 |
| 2015/0002321 A1* | 1/2015 | Zhou | H03M 1/0617 |
| | | | 341/118 |
| 2015/0263756 A1* | 9/2015 | Chiu | H03M 1/08 |
| | | | 341/172 |
| 2017/0302288 A1* | 10/2017 | Huang | H03M 1/1061 |
| 2019/0081636 A1* | 3/2019 | Chen | H03M 1/002 |
| 2019/0372582 A1* | 12/2019 | Aboudina | H03M 1/468 |
| 2023/0327680 A1* | 10/2023 | Xu | H03M 1/468 |

* cited by examiner

ADC ARCHITECTURE WITH NON-UNIFORM QUANTIZATION

BACKGROUND

Technical Field

This disclosure is directed to electronic circuits, and more particularly, to circuits for converting signals between an analog and digital format.

Description of the Related Art

Analog-to-digital converters (ADCs) are used in a wide variety of applications. To accommodate the different applications, a variety of ADCs are available. One type of ADC that is used in certain applications is known as a successive approximation register (SAR) ADC. A SAR ADC may use a binary search algorithm over a number of successive clock cycles to determine a digital value that corresponds to a received analog signal. For example, a first clock cycle may be used to determine a most significant bit (MSB) of a digital value, a second clock cycle may be used to determine a second-most significant bit, and so on. This approximation may continue until a least significant bit (LSB) is determined, after which the SAR ADC outputs the digital value and begins the next conversion.

SUMMARY

An ADC with non-uniform quantization is disclosed. In one embodiment, a SAR ADC includes a comparator configured to generate, during successive clock cycles, respective comparison signals based on an analog input signal and a corresponding offset voltage. The SAR ADC further includes a digital logic circuit configured to store values of the respective comparison signals for corresponding ones of the successive clock cycles and further configured to output a digital value after a specified number of successive clock cycles. An offset control circuit is configured to, for a current one of the successive clock cycles, generate the corresponding value of the offset voltage based on one or more of values of the respective comparison signals from previous clock cycles. Respective offset voltages for successive clock cycles are spaced such that the SAR ADC implements non-uniform quantization values.

BRIEF DESCRIPTION OF THE DRAWINGS

The following detailed description makes reference to the accompanying drawings, which are now briefly described.

DETAILED DESCRIPTION OF EMBODIMENTS

Figure 1:
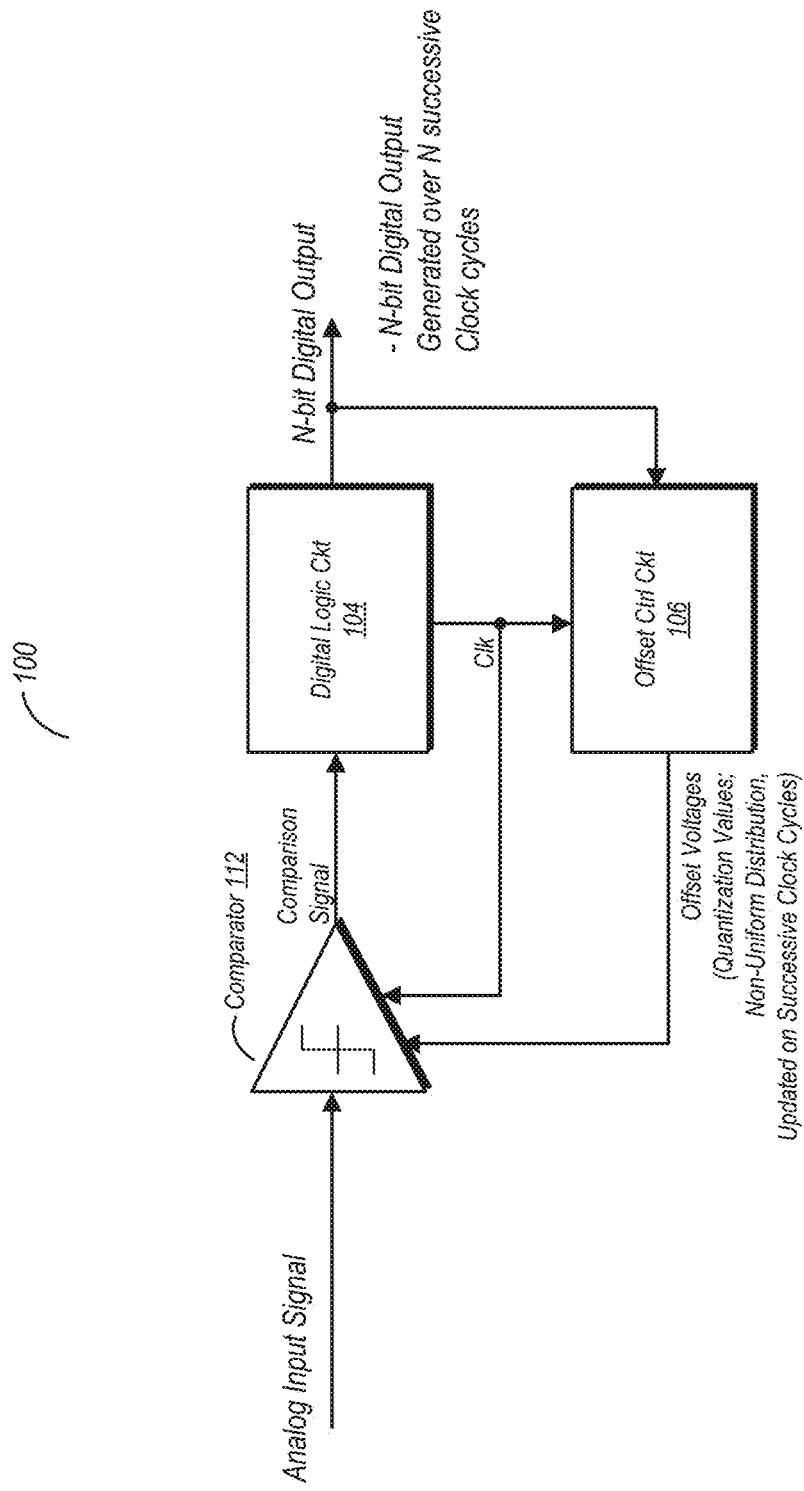
FIG. 1 is a block diagram of one embodiment of a SAR ADC.

SAR ADCs are used in a variety of different applications. One common application for which SAR ADCs are implemented is in serial links, including in the receivers thereof. In recent years, the data rates at which serial links have operated has increased significantly. Accordingly, instead of simply transmitting binary data, other types of signaling conventions have been employed. For example, PAM4 (Pulse Amplitude Modulation-4) transmits data in one of four signal levels, with each signal level comprising two bits. With signaling conventions such as PAM4, the addition of a SAR ADC may add robustness against variations in operating conditions, such as those resulting from process, voltage, and temperature (PVT). However, in the receiver block of a serial link, a SAR ADC may be the largest consumer of power.

When data is transmitted, the values contained therein are often times not equiprobable. In fact, in many cases, the different possible data values are in many, if not most cases, not equiprobable in their frequency of occurrence. However, quantization values used in an ADC, such as a SAR ADC, are typically implemented as though the different data values do have an equal occurrence in the transmitted data. This may in turn lead to a need for greater precision, and thus a greater number of bits in the output of a SAR ADC. A greater number of bits in the SAR ADC output can in turn increase its power consumption.

The present disclosure makes use of the insights above. Based on the observation that the occurrence of the various data values is not equiprobable, a SAR ADC according to the present disclosure is configured to provide non-uniform quantization. Accordingly, the SAR ADC as disclosed herein may utilize non-evenly spaced voltage levels to carry out the quantization of incoming analog signals. For example, if more data is concentrated near the center (e.g., as viewed on a scatter plot), more levels may be concentrated near the center of the plot. The voltage levels may be determined by an offset circuit, which provides these levels to a comparator based on observed data. Furthermore, in some embodiments, these quantization levels may be adjustable during operation.

Since the SAR ADC of the present disclosure utilizes non-uniform quantization, a lower number of quantization values may be used while achieving the same effective resolution. This may allow at least one bit of quantization to be eliminated. This elimination of a bit of quantization can result in significant power savings, cutting power consumption by half in some cases. Area consumed by the SAR ADC may also be reduced. The present disclosure further contemplates a SAR ADC with an adjustable quantization. In one embodiment, bypass switches may be used in conjunction with a digital-to-analog converter (DAC) that is used in the SAR ADC to bypass some bits. This may allow for power savings as well, and may also allow for more flexible implementation options.

Various embodiments of a SAR ADC per the present disclosure are now discussed in further detail. Hardware embodiments of a SAR ADC per the disclosure are discussed, followed by an example of non-uniform quantization that may be utilized by various embodiments. A serial communications link utilizing an embodiment of is also described. Discussion of various methods of operating a SAR ADC follows. The disclosure also includes descriptions of an example device, example systems, and a computer readable medium that may contain instructions for implementing circuitry according to the disclosure.

Embodiments of a SAR ADC:

Turning now to FIG. 1, a block diagram of one embodiment of a SAR ADC is shown. SAR ADC 100 is illustrated is configured to convert an analog input signal into an N-bit digital value over N different clock cycles. SAR ADC 100 of the illustrated embodiment includes a comparator 112, a digital logic circuit 104, and an offset control circuit 106.

Comparator 112 is configured to generate a comparison signal by performing a comparison of the analog input signal to a reference voltage. The reference voltage may be, or may be determined based on, an offset voltage generated by offset control circuit 106. The comparison signal may be output in accordance with a clock signal, Clk, that is also provided to offset control circuit. For each clock cycle, the offset voltage may be updated relative to the previous clock cycle. The comparison signal value in the embodiment shown is provided to digital logic circuit, where it is stored as part of the N-bit value to result from the conversion.

During the conversion, digital logic circuit 104 provides the partial N-bit digital value to offset control circuit 106. Using the partial value, offset control circuit 106 selects the next offset voltage value to be provided to comparator 112. In this manner, SAR ADC 100 in the embodiment shown determines the digital value corresponding to the voltage of the analog input signal using a binary search. During a first of the N clock cycles, the comparison carried out by comparator 112 may determine the most significant bit of the N-bit digital value. For subsequent comparisons, the bits of less significance are determined in order, with the Nth and final bit being the least significant bit of the digital value.

Offset control circuit 106 may select the offset voltage values such that they are not evenly spaced with respect to one another. More particularly, the offset voltage values may be spaced with respect to one another in such a manner that SAR ADC 100 implements non-uniform quantization, with most of the voltage levels concentrated where the data distribution is heaviest. This in turn may enable the reduction of at least one bit of quantization in SAR ADC 100 relative to an embodiment in which the voltage levels, and thus the quantization values, are evenly spaced. As a result, significant power savings may be realized, while faster conversions may also be enabled.

In various embodiments, offset control circuit 106 may provide the offset voltages to comparator 112 as analog voltage signals. In other embodiments, offset control circuit 106 may provide a digital value to comparator 112 which is used by the latter to generate the offset voltage value internally. Offset control circuitry 112 may also include additional circuitry/logic to support the generation of the various offset voltages. For example, offset control circuit 106 may include a counter or other circuit to track the various clock cycles to determine which of the N clock cycles for which a comparison is to be performed. Such circuitry may also include reset circuitry to indicate that the Nth comparison has been performed, which may cause the digital value to be output and the next conversion cycle to begin. If SAR ADC 100 is implemented in a system that can operate with a number of different operating modes and/or protocols, circuitry for determining the offset voltages based on these different modes/protocols may also be included. In embodiments offset control circuit 106 provides an analog voltage as the offset voltage to comparator 112, circuitry for generating and adjusting such an analog voltage may be incorporated therein.

Selection of the initial values for the offset voltages, and thus the quantization levels, may in various embodiment, be based on experimental data or test data to determine the distribution of various signal levels (and thus the data contained therein) received by a circuit that includes SAR ADC 100. The initial values may also be selected based on, e.g., a calibration procedure that may be carried out during system initialization. In various embodiments, these values may be updated based on the actual data received during operation. For example, offset control circuit 206 in the embodiment may include circuitry for storing history of the generated digital values output from digital logic circuit 104, as well as processing circuitry for analyzing the history to determine if different offset voltage levels should be used. In this manner, SAR ADC 200 may adapt to changing operating conditions due to, e.g., temperature and voltage.

Figure 2:
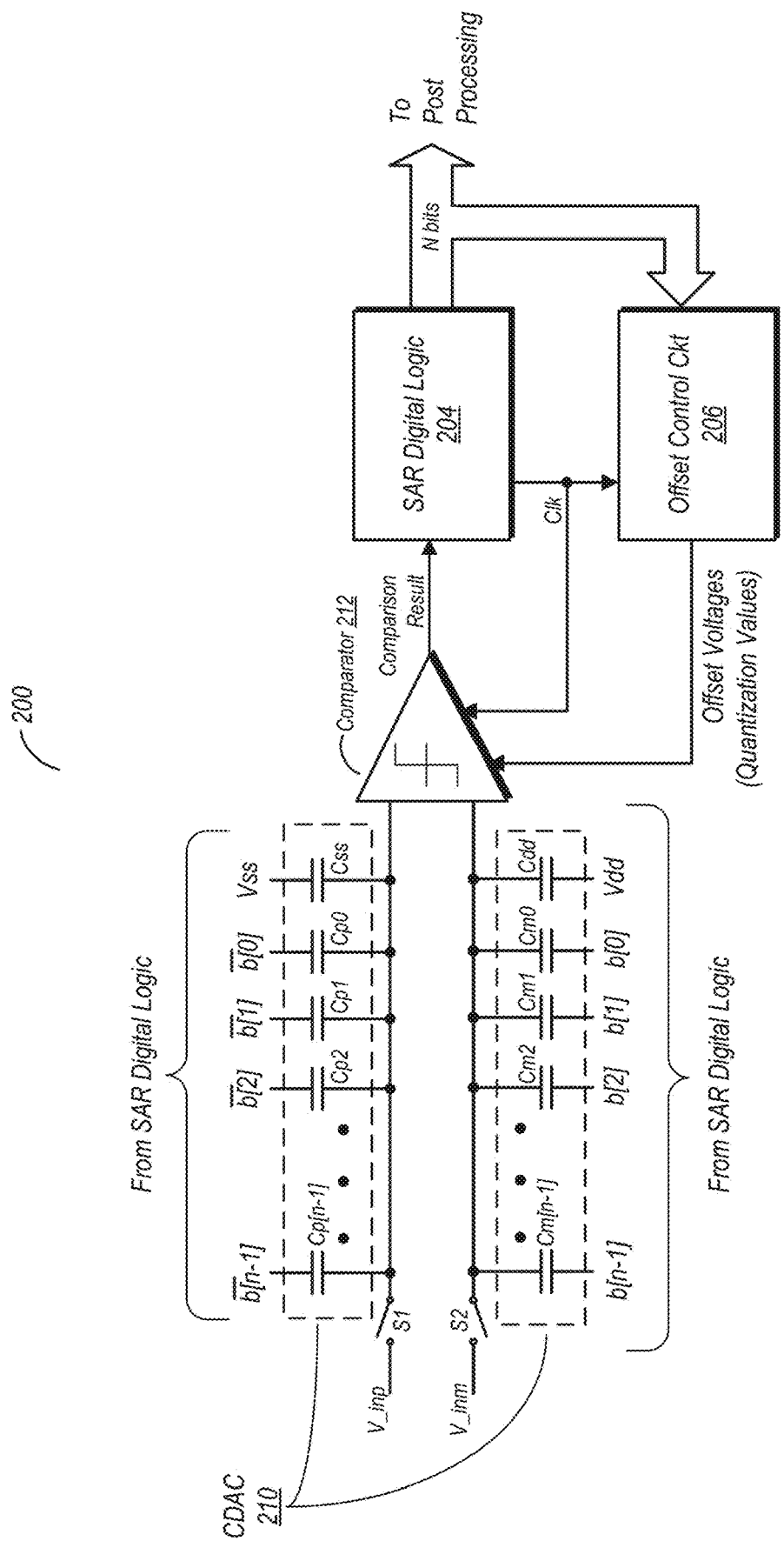
FIG. 2 is a diagram of another embodiment of a SAR ADC.

FIG. 2 is a block diagram of another embodiment of a SAR ADC. In the embodiment shown, SAR ADC 200 includes a comparator 212, SAR digital logic 204, offset control circuit 206, and capacitive digital-to-analog converter (CDAC) 210. While the digital-to-analog converter (DAC) used in this particular is a CDAC, it is noted that the disclosure is not intended to be limiting in this regard, and thus, DAC types other than CDACs may be used in various embodiments.

In the embodiment shown, SAR ADC 200 is configured to receive the analog input signal as a differential signal having the components V_inp and V_inm. A switch S1 may be closed to receive the component V_inp, while switch S2 may be closed to receive the component V_inm. Comparator 212 in the embodiment shown is configured to compare the differential between these two components to a reference value to generate comparison signals on successive clock cycles (of the clock signal, Clk) during the conversion process. The reference value in the embodiment shown is generated based on offset voltages generated or indicated by offset control circuit 206. The offset voltages generated by offset control circuit 206 correspond to quantization values for conversion of the analog input signal into a digital value. Similar to the embodiment discussed above, offset control circuit 206 may be used to implement non-uniform quantization by causing the various offset voltages to be unevenly spaced with respect to one another. Furthermore, in at least some embodiment, offset control circuit 206 may change the particular offset voltages in response to the history digital values resulting form the conversion of analog signals.

Over a plurality of N clock cycles of a given conversion, SAR digital logic 204 stores the determined values. At the end of a conversion cycle (e.g., after N clock cycles), SAR digital logic 204 outputs an N-bit value, and the conversion process then begins for the next input signal.

During the conversion process, the differential signal components of the analog input signal may be modified by CDAC 210 in conjunction with the bits as determined by SAR digital logic 204. In the embodiment shown, capacitors $Cm[n-1]$ to $Cm0$ are coupled to receive determined bits of a digital value from SAR digital logic 204, while capacitors $Cp[n-1]$ to $Cp0$ are coupled to receive the complementary values of the determined bits. $Cm[n-1]$ to $Cm0$ are coupled to the signal path for the component V_inm, while Cp[n−1] to C0 are coupled to the signal path for V_inp. Additionally, a capacitor Cdd is coupled between a power supply node and the signal path for V_inm, while another capacitor Css is coupled between a reference node and the signal path for V_inp.

Similar to the operation of the SAR ADC illustrated in FIG. 1, the conversion process carried out by SAR ADC 200 determines the most significant bit first and then determines the remaining bits in descending order of significance until the least significant bit is known. Accordingly, after a first cycle of operation, b[n−1] (the most significant bit) is provided to Cm[n−1], while its complement is provided to cp[n−1]. This may repeat for each of the bits until the full, N-bit digital value is determined.

As with the embodiment shown in FIG. 1, SAR ADC 200 may perform the conversion of the analog input signal using a binary search. More particularly, during a given clock cycle, comparator 212 may compare a differential between the voltages of the differential signal components V_inp and V_inm to a value determined based on the offset voltage received from or indicated by offset control circuit 206. As each bit is determined, SAR digital logic 204 feeds both its true and complementary values to the appropriate DAC capacitors, which modify the input signal for the next comparison to determine the next bit value. This process continues for each of N clock cycles, starting with the determination of the most significant bit, in a descending order, until determining the least significant bit.

Figure 3:
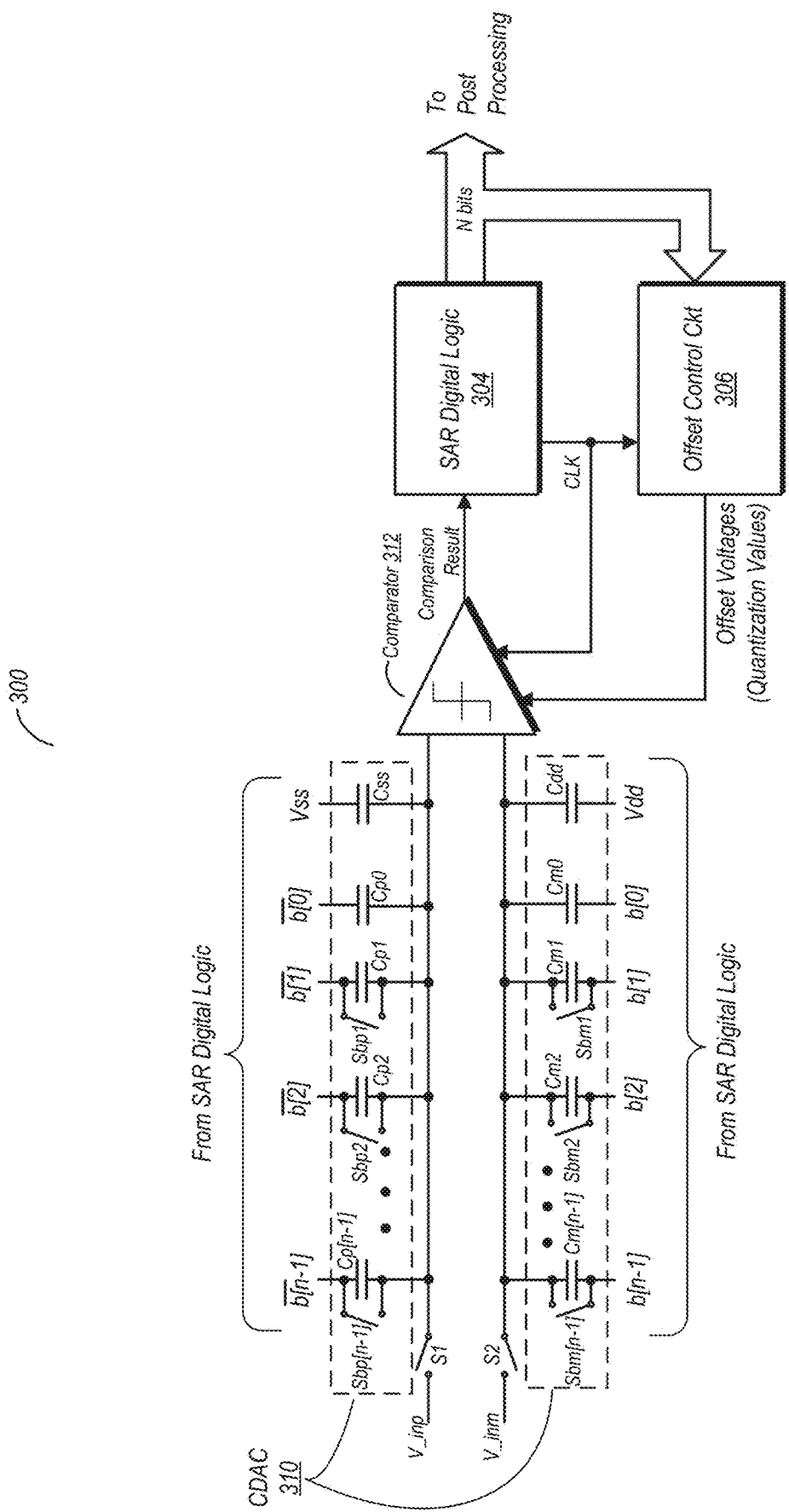
FIG. 3 is a diagram of another embodiment of a SAR ADC.

FIG. 3 is a diagram illustrating another embodiment of a SAR ADC. In the embodiment shown, SAR ADC 300 is similar to that shown in FIG. 2. As with that embodiment, SAR ADC 300 includes a comparator 312, SAR digital logic 305, offset control circuit 306, and CDAC 310. Each of these functional circuits may operate in a manner similar to their counterparts described above. However, in contrast to the embodiment of FIG. 2, the embodiment shown in FIG. 3 is configurable such that its number of quantization bits can be changed.

As shown in FIG. 3, selected capacitors of CDAC 310 are coupled in parallel with a corresponding switch, which is referred to herein as a bypass switch. The capacitors corresponding to a least significant bit and those coupled to a supply voltage/reference node do not have a corresponding bypass switch.

Using the bypass switches, the number of quantization values of CDAC 300 may be changed while maintaining the same effective resolution. For example, the number of quantization bits may be reduced by one bit in the embodiment shown by closing the bypass switches Sbp[n−1] and Sbm[n−1]. A further reduction in quantization bits may be carried out by also closing switches sbp2 and sbm2 in this particular embodiment. In closing bypass switches to reduce the number of quantization bits of SAR ADC 300, the most significant bits may be the first for which quantization is reduced, with further reductions occurring in descending order (similar to the conversion process).

As previously noted, reducing the number of quantization bits of a given SAR ADC by a single bit can significantly reduce power consumption. Furthermore, reducing the number of quantization bits by a bit can eliminate a clock cycle from the conversion process, thereby reducing the conversion time to obtain the digital value of an analog input signal. Furthermore, the ability to configure SAR ADC 300 and other configurable variations thereof may allow for its use with different signaling and/or communications protocols that may have varying numbers of levels. Accordingly, the configurability as shown here may result in more flexible implementations.

Figure 4:
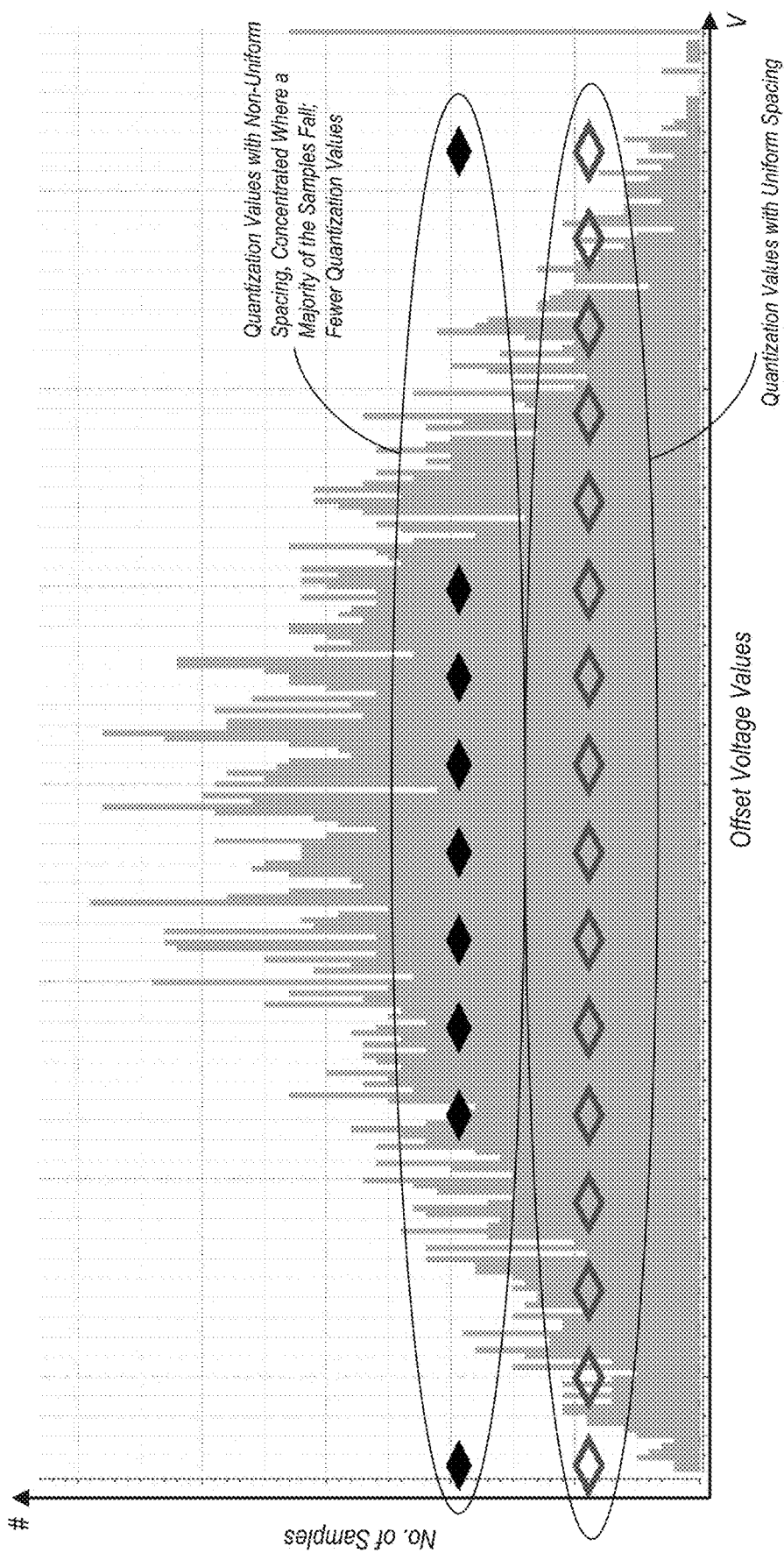
FIG. 4 is a diagram illustrating non-uniform quantization that may be carried out by one embodiment of a SAR ADC.

Non-Uniform Quantization:

FIG. 4 is a scatter plot used to illustrate non-uniform quantization that may be carried out by one embodiment of a SAR ADC per the present disclosure. In the illustrated example, the scatter plot illustrates the number of samples (on the vertical axis) vs. various offset voltage values (on the horizontal axis), with the offset voltage values corresponding to quantization values.

As can be seen in FIG. 4, the majority of the samples are concentrated toward the offset values toward the middle of the horizontal axis, with fewer samples on the ends/extremes. The scatter plot shown in FIG. 4 also illustrates the difference in the number of quantization values that can be used when non-uniform spacing it employed vs. the uniform quantization typically used in such ADCs. For the uniform spacing, a number of different quantization values are uniformly spaced across the horizontal axis. However, when the quantization values are arranged in a non-uniform manner and in accordance with the data shown in the scatter plot, there are fewer quantization values as shown in the given example. With a lesser number of quantization values for non-uniform spacing, vs. a greater number for uniform spacing, the effective resolution of a corresponding ADC may be the same with fewer quantization values. In the SAR ADCs discussed above, this can result in both power and time savings in carrying out conversion of analog signals into digital values. Area savings may also be achieved, as a smaller CDAC may be implemented.

Figure 5:
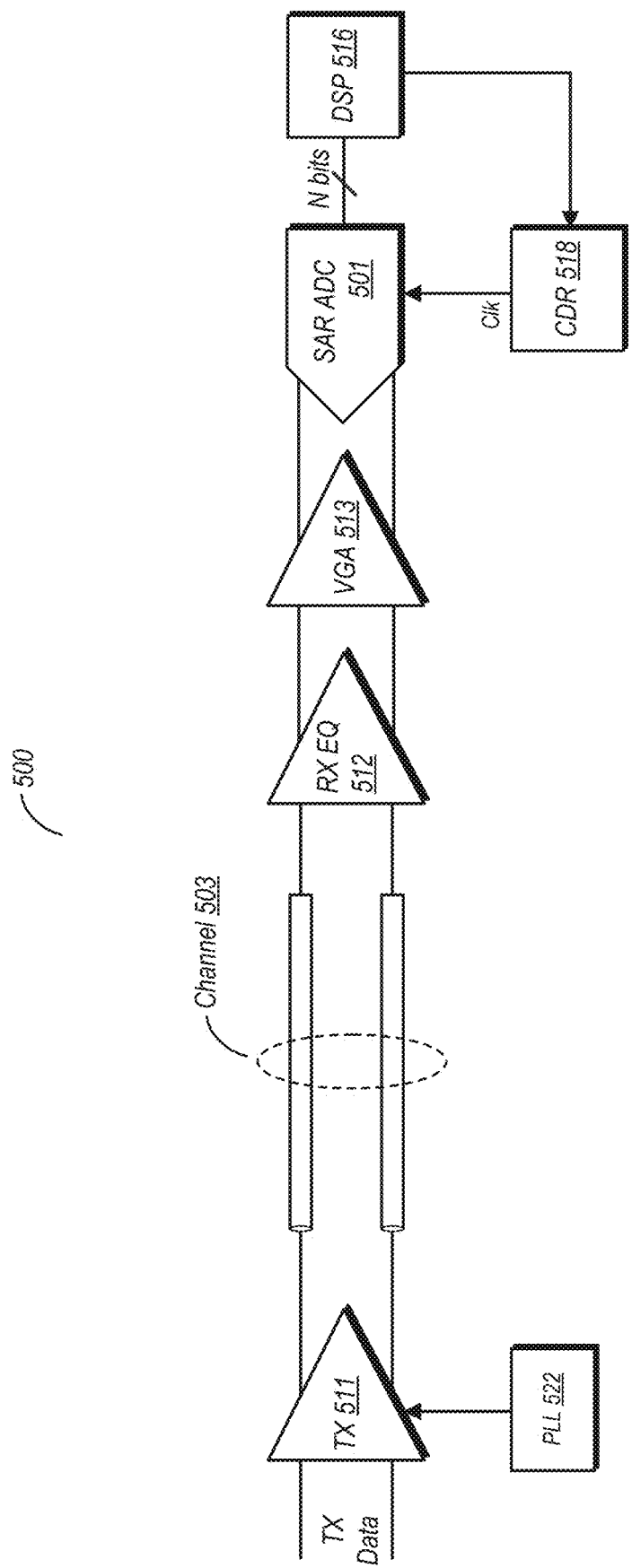
FIG. 5 is a block diagram of one embodiment of a communications link.

Serial Communications Link:

FIG. 5 is a diagram illustrating one embodiment of a serial communications link. In the embodiment shown, serial link 500 includes a transmitter 511, a phase locked loop (PLL) 522, a channel 503 (e.g., a transmission medium), a receiver/equalizer 512, a variable gain amplifier (VGA) 513, SAR ADC 501, a digital signal processing (DSP) circuit 516, and a clock and data recovery (CDR) circuit 518.

Transmitter 511 may receive data for transmission (TX data) from a source such as another digital signal processor or other circuit from which communications may be originated. In accordance with a periodic (clock) signal generated by PLL 522, transmitter 511 may transmit signals onto the transmission medium that implements channel 503.

On the receive end, receiver/equalizer may initially receive the incoming signals transmitted from transmitter 511. Receiver/equalizer 512 in some embodiments may implement a continuous time linear equalizer (CTLE) to perform equalization on the incoming signals. Amplification of the incoming signals may be carried out by VGA 513, which then provides the amplified signals to SAR ADC 501. SAR ADC 501 in the embodiment shown may be any embodiment of a SAR ADC as disclosed herein, and may implement non-uniform quantization such that number of quantization values can be reduced and concentrated where a majority of the data is received with respect to a spectrum of offset voltage values upon which quantization is based. A clock signal used to synchronize operations of SAR ADC 501 may be received from CDR circuit 518, as the transmitted data may include a clock signal embedded therein. The N-bit output of SAR ADC 501 may be forwarded to DSP circuit 515, which may perform additional processing of the data, and may also provide information to CDR circuit 518 to enable recovery of the clock signal.

It is noted that, while a serial link is shown here as one possible application of a SAR ADC per the present disclosure, this example is not intended to be limiting. On the contrary, the SAR ADC of the present disclosure may be implemented in a wide variety of applications for which it may be suitable.

Figure 6:
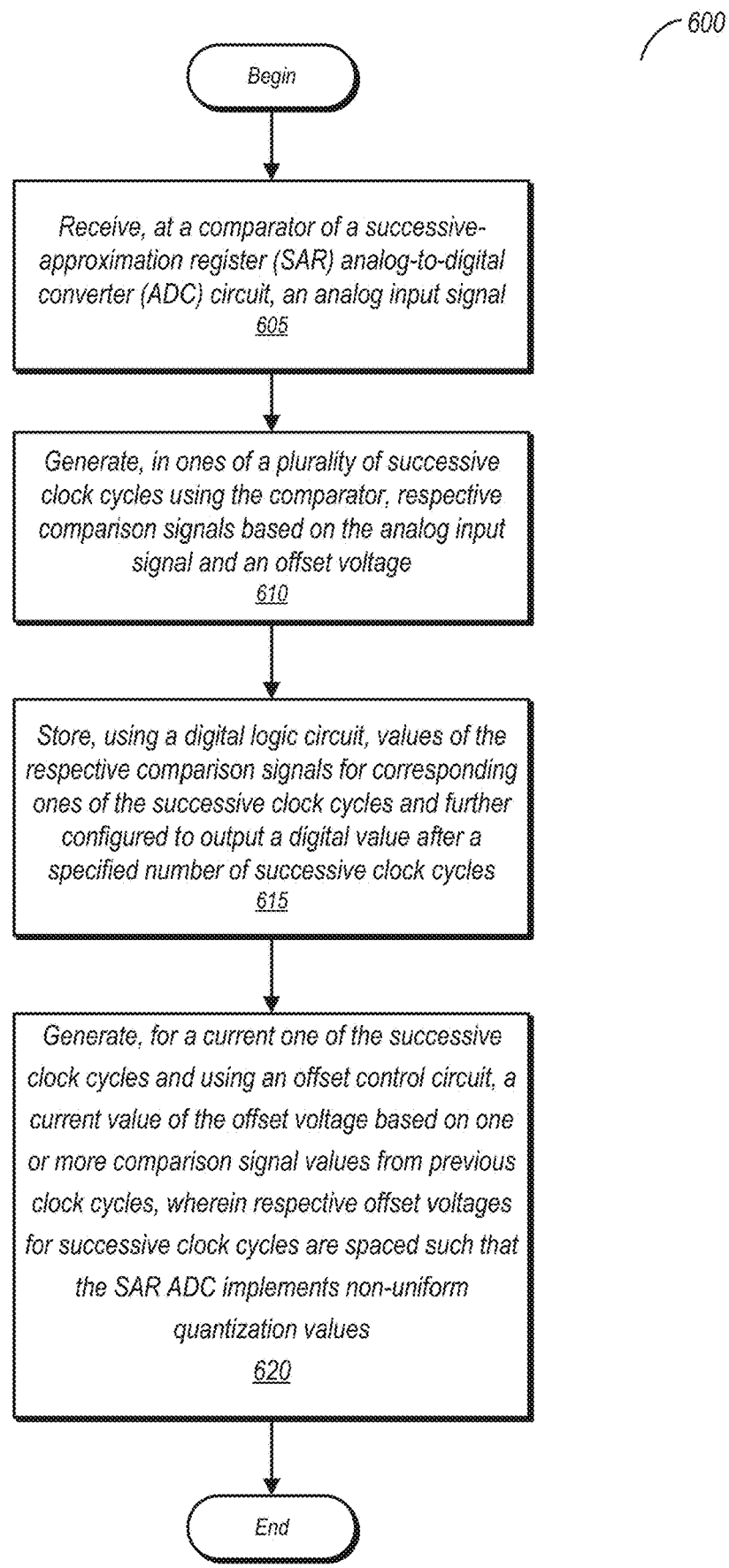
FIG. 6 is a flow diagram illustrating one embodiment of a method for operating a SAR ADC.

Methods of Operating a SAR ADC:

Turning now to FIG. 6, a method for operating a SAR ADC is disclosed. Method 600 may be carried out by any of the hardware embodiments discussed above. Embodiments of a SAR ADC that are capable of carrying out Method 600, but not explicitly discussed herein, are also considered to fall within the scope of this disclosure.

Method 600 includes receiving, at a comparator of a successive-approximation register (SAR) analog-to-digital converter (ADC) circuit, an analog input signal (block 605). The method further includes generating, in ones of a plurality of successive clock cycles using the comparator, respective comparison signals based on the analog input signal and an offset voltage (block 610). Method 600 also includes storing, using a digital logic circuit, values of the respective comparison signals for corresponding ones of the successive clock cycles and further configured to output a digital value after a specified number of successive clock cycles (block 615). The method also includes generating, for a current one of the successive clock cycles and using an offset control circuit, a current value of the offset voltage based on one or more comparison signal values from previous clock cycles, wherein respective offset voltages for successive clock cycles are spaced such that the SAR ADC implements non-uniform quantization values (block 620).

In various embodiments, the method includes generating, using the SAR ADC, and N-bit value over N successive clock cycles, wherein N is a configurable value. In such embodiments, the method may also include reducing a value of N by closing at least one bypass switch.

Some embodiments of the method include modifying, using the offset control circuit, the non-uniform quantization values. Some embodiments may include modifying, using a capacitive digital-to-analog converter (CDAC), the analog input signal. Modifying the analog input signal in various embodiments comprises the digital logic circuit conveying portions of the digital value to capacitors of the CDAC.

Figure 7:
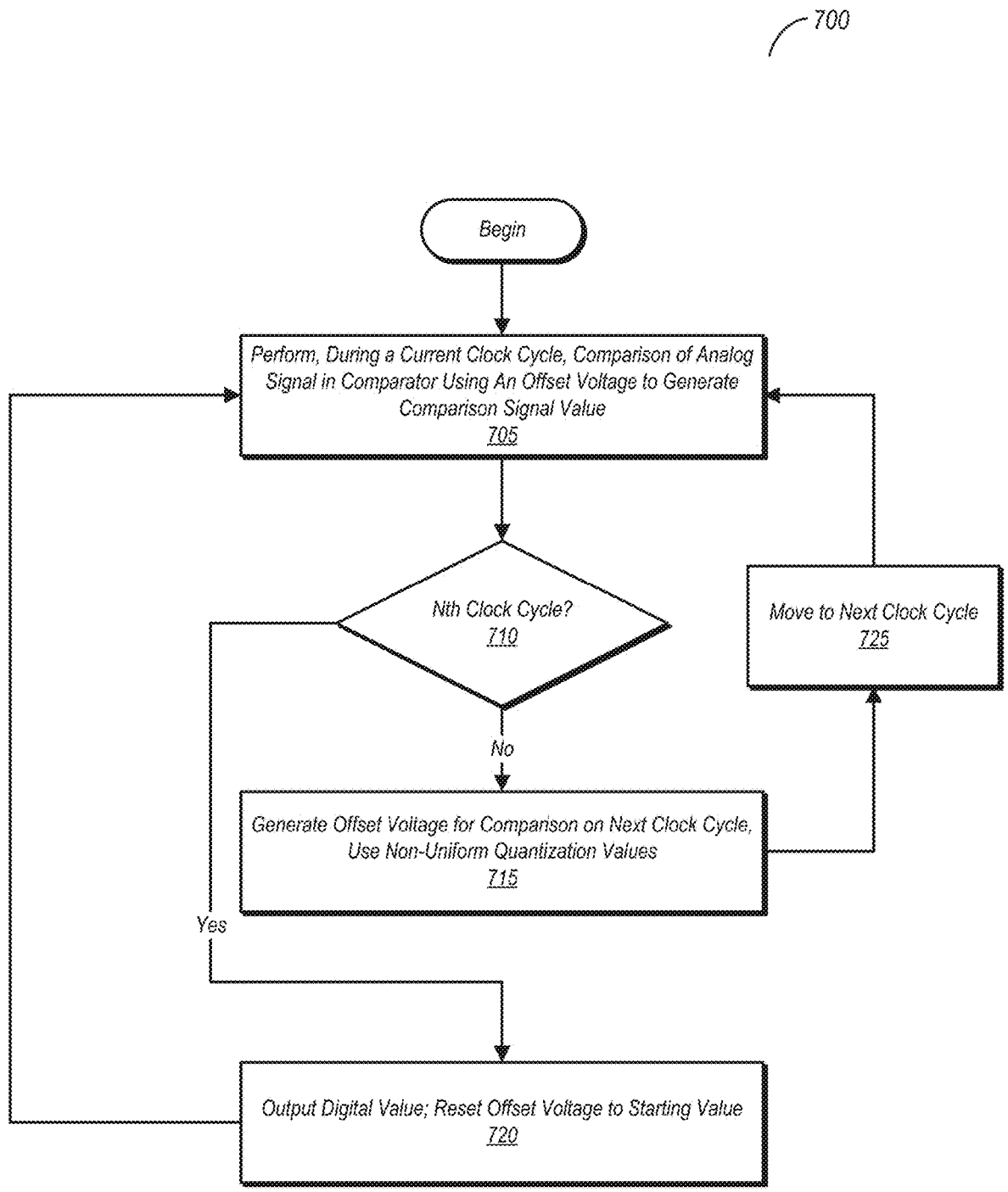
FIG. 7 is a flow diagram illustrating another embodiment of a method for operating a SAR ADC.

FIG. 7 is another embodiment of a method for operating a SAR ADC. Method 700 may be carried out by any of the various embodiments of a SAR ADC as discussed above. Embodiments of a SAR ADC capable of carrying out method 700, but not explicitly disclosed herein, are also considered to fall within the scope of this disclosure.

Method 700 includes performing, during a current clock cycle, a comparison of an analog signal in a comparator using an offset voltage value to generate the comparison signal value (block 705). The SAR ADC may be configured to output an N-bit value over N clock cycles. If the current clock cycle is not the Nth clock cycle (block 710, no), an offset voltage is generated for the next comparison, with the generating performed such that the SAR ADC implements non-uniform quantization values (block 715). In generating the offset voltages to implement non-uniform quantization, the values of the offset voltage may be unevenly spaced with respect to one another. After generating the offset voltage value for the current clock cycle, method 700 moves to the next cycle (block 725) and returns to block 705.

If, during the comparison of block 705, the clock cycle is the Nth clock cycle (block 710, yes), a digital value corresponding to the analog input signal is output, and the offset voltage is reset to its beginning value (block 720). Thereafter, the method returns to block 705, and the conversion process begins again.

Figure 8:
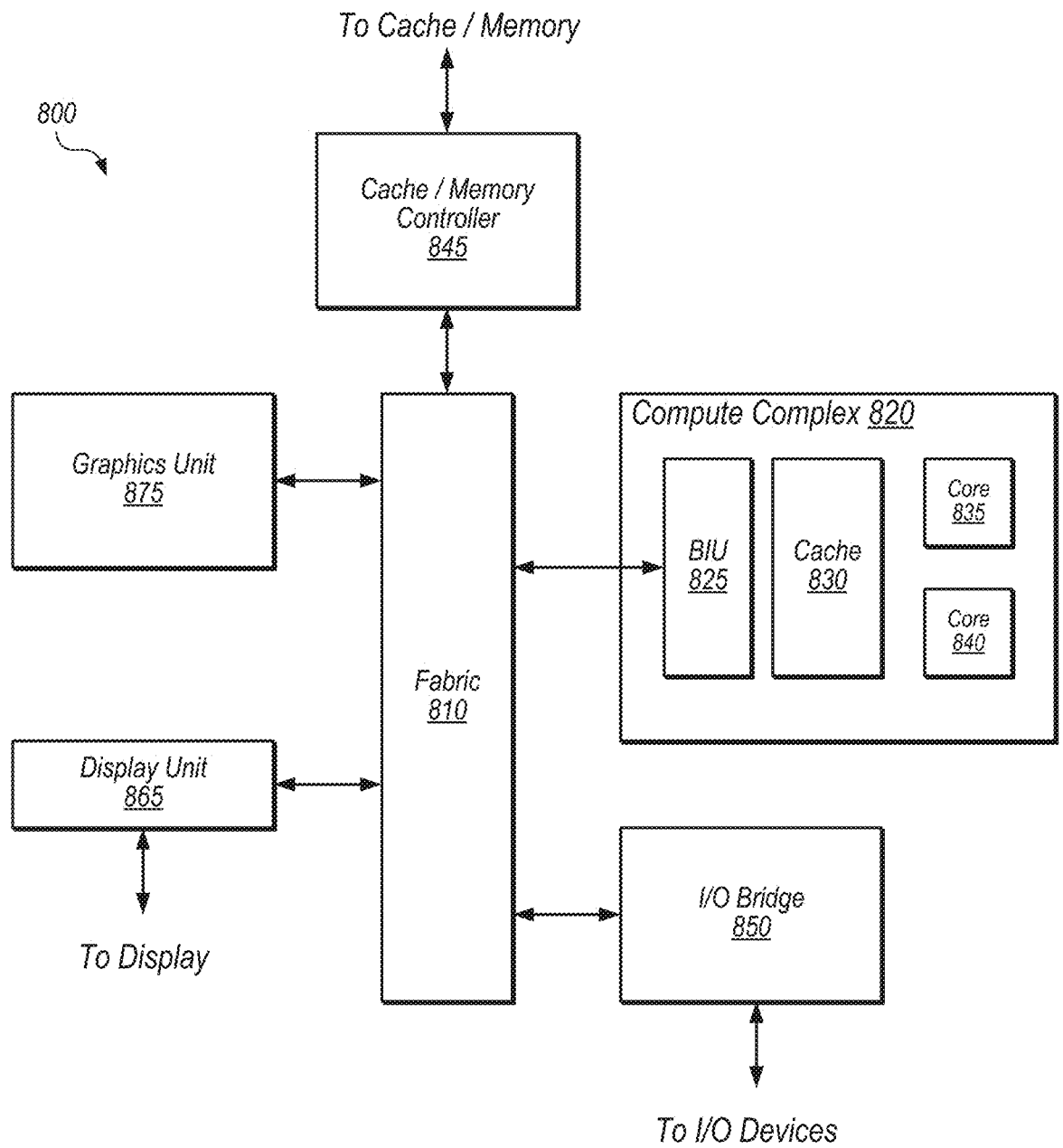
FIG. 8 is a block diagram of one embodiment of an example device which may implement a memory controller according to the disclosure.

Example Device:

Referring now to FIG. 8, a block diagram illustrating an example embodiment of a device 800 is shown. In some embodiments, elements of device 800 may be included within a system on a chip. In some embodiments, device 800 may be included in a mobile device, which may be battery-powered. Therefore, power consumption by device 800 may be an important design consideration. In the illustrated embodiment, device 800 includes fabric 810, compute complex 820 input/output (I/O) bridge 850, cache/memory controller 845, graphics unit 875, and display unit 865. In some embodiments, device 800 may include other components (not shown) in addition to or in place of the illustrated components, such as video processor encoders and decoders, image processing or recognition elements, computer vision elements, etc.

Fabric 810 may include various interconnects, buses, MUX's, controllers, etc., and may be configured to facilitate communication between various elements of device 800. In some embodiments, portions of fabric 810 may be configured to implement various different communication protocols. In other embodiments, fabric 810 may implement a single communication protocol and elements coupled to fabric 810 may convert from the single communication protocol to other communication protocols internally.

In the illustrated embodiment, compute complex 820 includes bus interface unit (BIU) 825, cache 830, and cores 835 and 840. In various embodiments, compute complex 820 may include various numbers of processors, processor cores and caches. For example, compute complex 820 may include 1, 2, or 4 processor cores, or any other suitable number. In one embodiment, cache 830 is a set associative L2 cache. In some embodiments, cores 835 and 840 may include internal instruction and data caches. In some embodiments, a coherency unit (not shown) in fabric 810, cache 830, or elsewhere in device 800 may be configured to maintain coherency between various caches of device 800. BIU 825 may be configured to manage communication between compute complex 820 and other elements of device 800. Processor cores such as cores 835 and 840 may be configured to execute instructions of a particular instruction set architecture (ISA) which may include operating system instructions and user application instructions. These instructions may be stored in computer readable medium such as a memory coupled to memory controller 845 discussed below.

As used herein, the term "coupled to" may indicate one or more connections between elements, and a coupling may include intervening elements. For example, in FIG. 8, graphics unit 875 may be described as "coupled to" a memory through fabric 810 and cache/memory controller 845. In contrast, in the illustrated embodiment of FIG. 8, graphics unit 875 is "directly coupled" to fabric 810 because there are no intervening elements.

Cache/memory controller 845 may be configured to manage transfer of data between fabric 810 and one or more caches and memories. For example, cache/memory controller 845 may be coupled to an L3 cache, which may in turn be coupled to a system memory. In other embodiments, cache/memory controller 845 may be directly coupled to a memory. In some embodiments, cache/memory controller 845 may include one or more internal caches. Memory coupled to controller 845 may be any type of volatile memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR4, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit in a chip-on-chip configuration, a package-on-package configuration, or a multi-chip module configuration. Memory coupled to controller 845 may be any type of non-volatile memory such as NAND flash memory, NOR flash memory, nano RAM (NRAM), magneto-resistive RAM (MRAM), phase change RAM (PRAM), Racetrack memory, Memristor memory, etc. As noted above, this memory may store program instructions executable by compute complex 820 to cause the computing device to perform functionality described herein.

Graphics unit 875 may include one or more processors, e.g., one or more graphics processing units (GPUs). Graphics unit 875 may receive graphics-oriented instructions, such as OPENGL®, Metal®, or DIRECT3D® instructions, for example. Graphics unit 875 may execute specialized GPU instructions or perform other operations based on the received graphics-oriented instructions. Graphics unit 875 may generally be configured to process large blocks of data in parallel and may build images in a frame buffer for output to a display, which may be included in the device or may be a separate device. Graphics unit 875 may include transform, lighting, triangle, and rendering engines in one or more graphics processing pipelines. Graphics unit 875 may output pixel information for display images. Graphics unit 875, in various embodiments, may include programmable shader circuitry which may include highly parallel execution cores configured to execute graphics programs, which may include pixel tasks, vertex tasks, and compute tasks (which may or may not be graphics-related).

Display unit 865 may be configured to read data from a frame buffer and provide a stream of pixel values for display. Display unit 865 may be configured as a display pipeline in some embodiments. Additionally, display unit 865 may be configured to blend multiple frames to produce an output frame. Further, display unit 865 may include one or more interfaces (e.g., MIPI® or embedded display port (eDP)) for coupling to a user display (e.g., a touchscreen or an external display).

I/O bridge 850 may include various elements configured to implement: universal serial bus (USB) communications, security, audio, and low-power always-on functionality, for example. I/O bridge 850 may also include interfaces such as pulse-width modulation (PWM), general-purpose input/output (GPIO), serial peripheral interface (SPI), and inter-integrated circuit (I2C), for example. Various types of peripherals and devices may be coupled to device 800 via I/O bridge 850.

In some embodiments, device 800 includes network interface circuitry (not explicitly shown), which may be connected to fabric 810 or I/O bridge 850. The network interface circuitry may be configured to communicate via various networks, which may be wired, wireless, or both. For example, the network interface circuitry may be configured to communicate via a wired local area network, a wireless local area network (e.g., via Wi-Fi™), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth® or Wi-Fi™ Direct), etc. In various embodiments, the network interface circuitry may provide device 800 with connectivity to various types of other devices and networks. It is further noted that serial links utilizing a SAR ADC as disclosed herein may be implemented in the device, where appropriate.

Figure 9:
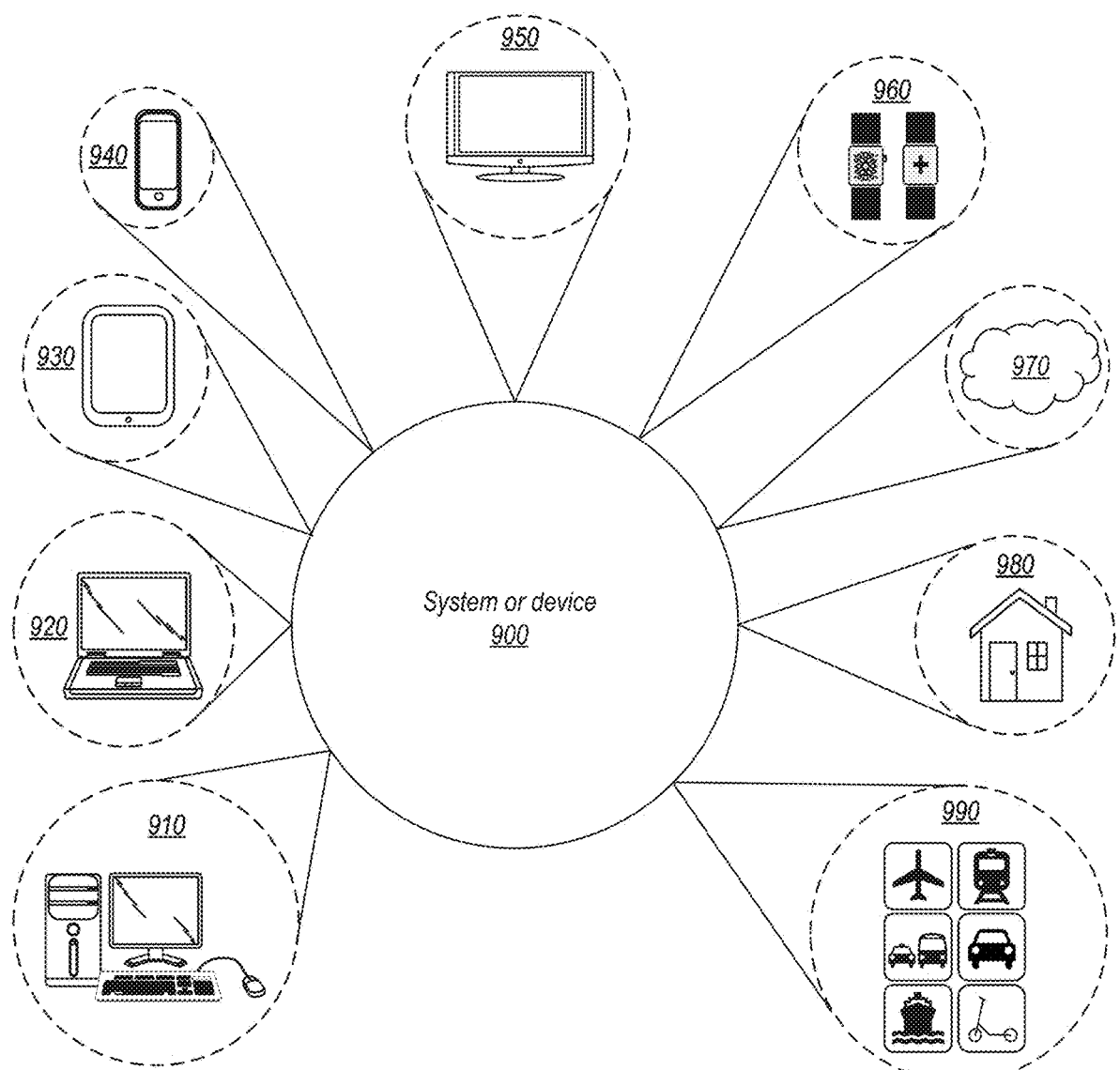
FIG. 9 is a block diagram illustrating example applications of an integrated circuit having a memory controller according to the disclosure.

Example Applications:

Turning now to FIG. 9, various types of systems that may include any of the circuits, devices, or system discussed above. System or device 900, which may incorporate or otherwise utilize one or more of the techniques described herein, may be utilized in a wide range of areas. For example, system or device 900 may be utilized as part of the hardware of systems such as a desktop computer 910, laptop computer 920, tablet computer 930, cellular or mobile phone 940, or television 950 (or set-top box coupled to a television).

Similarly, disclosed elements may be utilized in a wearable device 960, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 900 may also be used in various other contexts. For example, system or device 900 may be utilized in the context of a server computer system, such as a dedicated server or on shared hardware that implements a cloud-based service 970. Still further, system or device 900 may be implemented in a wide range of specialized everyday devices, including devices 980 commonly found in the home such as refrigerators, thermostats, security cameras, etc. The interconnection of such devices is often referred to as the "Internet of Things" (IoT). Elements may also be implemented in various modes of transportation. For example, system or device 900 could be employed in the control systems, guidance systems, entertainment systems, etc. of various types of vehicles 990.

The applications illustrated in FIG. 9 are merely exemplary and are not intended to limit the potential future applications of disclosed systems or devices. Other example applications include, without limitation: portable gaming devices, music players, data storage devices, unmanned aerial vehicles, etc. The disclosure also contemplates applications including head-mounted devices, dual-display devices, other types of wearable devices not otherwise mentioned above, and various types of multimedia devices.

Example Computer-Readable Medium:

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that programs a computing system to generate a simulation model of the hardware circuit, programs a fabrication system configured to produce hardware (e.g., an integrated circuit) that includes the disclosed circuitry, etc. Claims to such a storage medium are intended to cover, for example, an entity that produces a circuit design, but does not itself perform complete operations such as: design simulation, design synthesis, circuit fabrication, etc.

Figure 10:
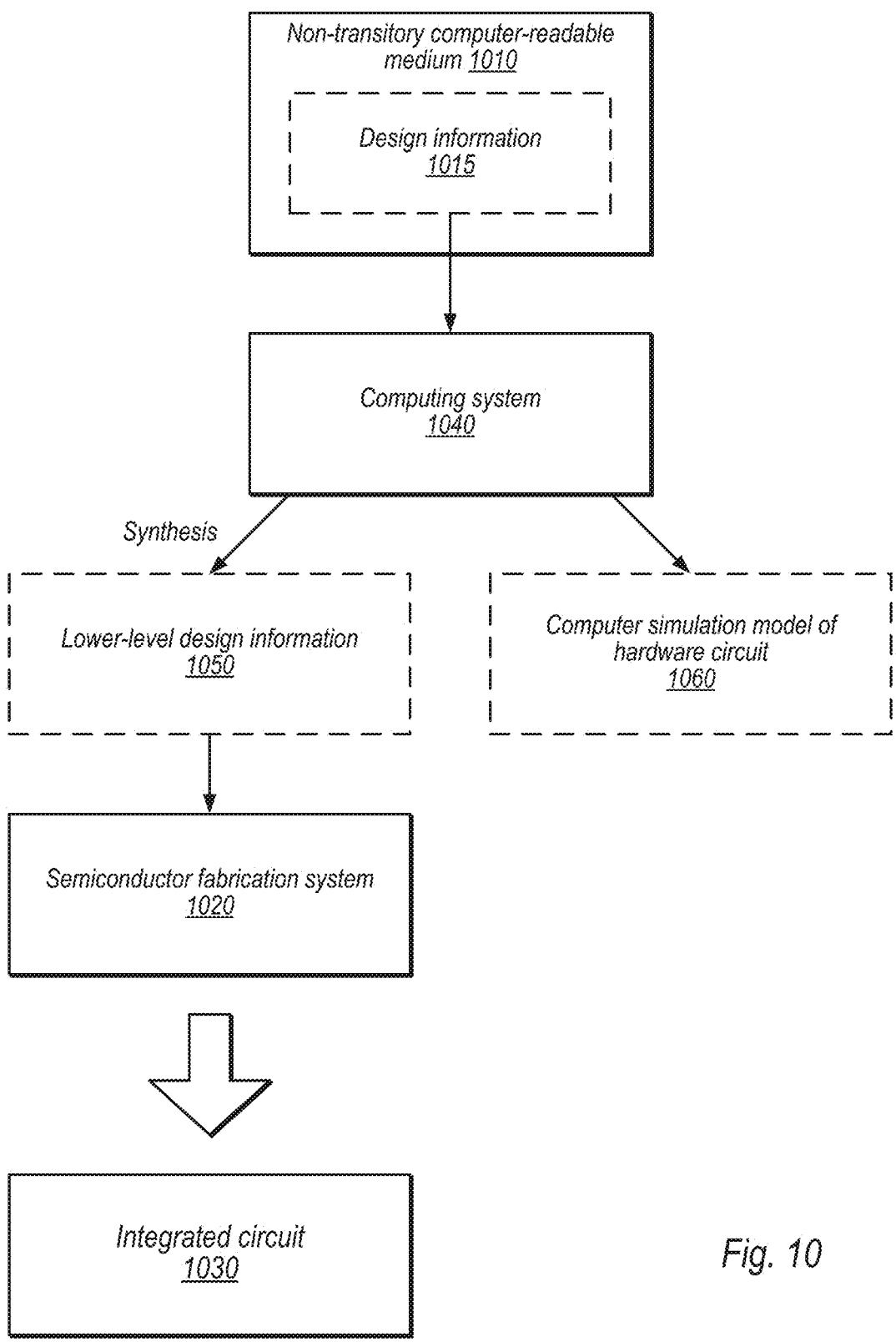
FIG. 10 is a block diagram of one embodiment of a computer readable medium and a manufacturing system capable of manufacturing a circuit including a memory controller according to the disclosure.

FIG. 10 is a block diagram illustrating an example non-transitory computer-readable storage medium that stores circuit design information, according to some embodiments. In the illustrated embodiment, computing system 1040 is configured to process the design information. This may include executing instructions included in the design information, interpreting instructions included in the design information, compiling, transforming, or otherwise updating the design information, etc. Therefore, the design information controls computing system 1040 (e.g., by programming computing system 1040) to perform various operations discussed below, in some embodiments.

In the illustrated example, computing system 1040 processes the design information to generate both a computer simulation model of a hardware circuit 1060 and lower-level design information 1050. In other embodiments, computing system 1040 may generate only one of these outputs, may generate other outputs based on the design information, or both. Regarding the computing simulation, computing system 1040 may execute instructions of a hardware description language that includes register transfer level (RTL) code, behavioral code, structural code, or some combination thereof. The simulation model may perform the functionality specified by the design information, facilitate verification of the functional correctness of the hardware design, generate power consumption estimates, generate timing estimates, etc.

In the illustrated example, computing system 1040 also processes the design information to generate lower-level design information 1050 (e.g., gate-level design information, a netlist, etc.). This may include synthesis operations, as shown, such as constructing a multi-level network, optimizing the network using technology-independent techniques, technology dependent techniques, or both, and outputting a network of gates (with potential constraints based on available gates in a technology library, sizing, delay, power, etc.). Based on lower-level design information 1050 (potentially among other inputs), semiconductor fabrication system 1020 is configured to fabricate an integrated circuit 1030 (which may correspond to functionality of the simulation model 1060). Note that computing system 1040 may generate different simulation models based on design information at various levels of description, including information 1050, 1015, and so on. The data representing design information 1050 and model 1060 may be stored on medium 1010 or on one or more other media.

In some embodiments, the lower-level design information 1050 controls (e.g., programs) the semiconductor fabrication system 1020 to fabricate the integrated circuit 1030. Thus, when processed by the fabrication system, the design information may program the fabrication system to fabricate a circuit that includes various circuitry disclosed herein.

Non-transitory computer-readable storage medium 1010, may comprise any of various appropriate types of memory devices or storage devices. Non-transitory computer-readable storage medium 1010 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1010 may include other types of non-transitory memory as well or combinations thereof. Accordingly, non-transitory computer-readable storage medium 1010 may include two or more memory media; such media may reside in different locations—for example, in different computer systems that are connected over a network.

Design information 1015 may be specified using any of various appropriate computer languages, including hardware description languages such as, without limitation: VHDL, Verilog, SystemC, System Verilog, RHDL, M, MyHDL, etc. The format of various design information may be recognized by one or more applications executed by computing system 1040, semiconductor fabrication system 1020, or both. In some embodiments, design information may also include one or more cell libraries that specify the synthesis, layout, or both of integrated circuit 1030. In some embodiments, the design information is specified in whole or in part in the form of a netlist that specifies cell library elements and their connectivity. Design information discussed herein, taken alone, may or may not include sufficient information for fabrication of a corresponding integrated circuit. For example, design information may specify the circuit elements to be fabricated but not their physical layout. In this case, design information may be combined with layout information to actually fabricate the specified circuitry.

Integrated circuit 1030 may, in various embodiments, include one or more custom macrocells, such as memories, analog or mixed-signal circuits, and the like. In such cases, design information may include information related to included macrocells. Such information may include, without limitation, schematics capture database, mask design data, behavioral models, and device or transistor level netlists. Mask design data may be formatted according to graphic data system (GDSII), or any other suitable format.

Semiconductor fabrication system 1020 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1020 may also be configured to perform various testing of fabricated circuits for correct operation.

In various embodiments, integrated circuit 1030 and model 1060 are configured to operate according to a circuit design specified by design information 1015, which may include performing any of the functionality described herein. For example, integrated circuit 1030 may include any of various elements shown in FIGS. 1-5. Further, integrated circuit 1030 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components. Similarly, stating "instructions of a hardware description programming language" that are "executable" to program a computing system to generate a computer simulation model" does not imply that the instructions must be executed in order for the element to be met, but rather specifies characteristics of the instructions. Additional features relating to the model (or the circuit represented by the model) may similarly relate to characteristics of the instructions, in this context. Therefore, an entity that sells a computer-readable medium with instructions that satisfy recited characteristics may provide an infringing product, even if another entity actually executes the instructions on the medium.

Note that a given design, at least in the digital logic context, may be implemented using a multitude of different gate arrangements, circuit technologies, etc. As one example, different designs may select or connect gates based on design tradeoffs (e.g., to focus on power consumption, performance, circuit area, etc.). Further, different manufacturers may have proprietary libraries, gate designs, physical gate implementations, etc. Different entities may also use different tools to process design information at various layers (e.g., from behavioral specifications to physical layout of gates).

Once a digital logic design is specified, however, those skilled in the art need not perform substantial experimentation or research to determine those implementations. Rather, those of skill in the art understand procedures to reliably and predictably produce one or more circuit implementations that provide the function described by the design information. The different circuit implementations may affect the performance, area, power consumption, etc. of a given design (potentially with tradeoffs between different design goals), but the logical function does not vary among the different circuit implementations of the same circuit design.

In some embodiments, the instructions included in the design information instructions provide RTL information (or other higher-level design information) and are executable by the computing system to synthesize a gate-level netlist that represents the hardware circuit based on the RTL information as an input. Similarly, the instructions may provide behavioral information and be executable by the computing system to synthesize a netlist or other lower-level design information. The lower-level design information may program fabrication system 1020 to fabricate integrated circuit 1030.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus comprising:
a successive-approximation register (SAR) analog-to-digital converter (ADC) circuit configured to generate a digital value using an analog input signal, wherein the SAR ADC includes:
a comparator configured to generate, during successive clock cycles, respective comparison signals based on the analog input signal and a corresponding offset voltage;
a digital logic circuit configured to store values of the respective comparison signals for corresponding ones of the successive clock cycles and further configured to output a digital value after a specified number of successive clock cycles; and
an offset control circuit configured to, for a current one of the successive clock cycles, generate the corresponding value of the offset voltage based on one or more of values of the respective comparison signals from previous clock cycles, wherein respective offset voltages for successive clock cycles are spaced such that the SAR ADC implements non-uniform quantization values.

2. The apparatus of claim 1, further comprising a digital-to-analog converter (DAC) configured to modify the analog input signal over the successive clock cycles.

3. The apparatus of claim 2, wherein the DAC is a capacitive DAC (CDAC) comprising a plurality of capacitors.

4. The apparatus of claim 1, wherein the SAR ADC is configured to generate an N-bit output value over N successive clock cycles.

5. The apparatus of claim 4, wherein N is a configurable value.

6. The apparatus of claim 5, further comprising a plurality of bypass switches, wherein, when a given one of the bypass switches is closed, a value of N is reduced by one.

7. The apparatus of claim 1, wherein the respective offset voltage values are configurable.

8. The apparatus of claim 7, wherein the respective offset voltage values are selected based on distribution of incoming data values embedded in the analog input signal.

9. The apparatus of claim 1, further comprising an amplifier configured to generate the analog input signal.

10. The apparatus of claim 9, further comprising an equalizer coupled to receive an incoming signal from a transmission line, wherein the equalizer is configured to generate an equalized signal, and wherein the amplifier is configured to generate the analog input signal using the equalized signal.

11. A method comprising:
receiving, at a comparator of a successive-approximation register (SAR) analog-to-digital converter (ADC) circuit, an analog input signal;

generating, in ones of a plurality of successive clock cycles using the comparator, respective comparison signals based on the analog input signal and an offset voltage;

storing, using a digital logic circuit, values of the respective comparison signals for corresponding ones of the successive clock cycles and further configured to output a digital value after a specified number of successive clock cycles; and generating, for a current one of the successive clock cycles and using an offset control circuit, a current value of the offset voltage based on one or more comparison signal values from previous clock cycles, wherein respective offset voltages for successive clock cycles are spaced such that the SAR ADC implements non-uniform quantization values.

12. The method of claim 11, further comprising generating, using the SAR ADC, and N-bit value over N successive clock cycles, wherein N is a configurable value.

13. The method of claim 12, further comprising reducing a value of N by closing at least one bypass switch.

14. The method of claim 11, further comprising modifying, using the offset control circuit, the non-uniform quantization values.

15. The method of claim 11, further comprising modifying, using a capacitive digital-to-analog converter (CDAC), the analog input signal.

16. The method of claim 15, wherein modifying the analog input signal comprises the digital logic circuit conveying portions of the digital value to capacitors of the CDAC.

17. A system comprising:
an equalizer circuit configured to generate an equalized signal using an incoming signal received via a transmission medium;
an amplifier configured to generate an analog input signal by amplifying the equalized signal; and
a successive-approximation register (SAR) analog-to-digital converter (ADC) circuit configured to generate, over successive clock cycles, a digital value using the analog input signal, wherein the SAR ADC includes:
an offset control circuit configured to, for a current one of the successive clock cycles, generate a corresponding value of an offset voltage used as a basis for comparison with a voltage level of the analog input signal, wherein the SAR ADC is configured to generate the digital value by performing comparisons over N successive clock cycles, and wherein the offset control circuit is configured to generate the offset voltages such that the SAR ADC implements non-uniform quantization values.

18. The system of claim 17, wherein the SAR ADC further includes:
a comparator configured to generate, during the successive clock cycles, respective comparison signals based on the analog input signal and a corresponding offset voltage;
a digital logic circuit configured to store values of the respective comparison signals for corresponding ones of the successive clock cycles and further configured to output a digital value after a specified number of successive clock cycles; and
a capacitive digital-to-analog converter (CDAC) configured to modify the analog input signal over the successive clock cycles.

19. The system of claim 18, wherein the digital logic circuit is configured to output an N-bit value every N of the successive clock cycles, wherein the value of N is configurable using bypass switches coupled to capacitors in the CDAC.

20. The system of claim 17, wherein the offset control circuit is configured to implement the non-uniform quantization values based on a distribution of data received via the transmission medium.

* * * * *